United States Patent [19]
Burnham

[11] Patent Number: 4,671,830
[45] Date of Patent: Jun. 9, 1987

[54] METHOD OF CONTROLLING THE MODELING OF THE WELL ENERGY BAND PROFILE BY INTERDIFFUSION

[75] Inventor: Robert D. Burnham, Palo Alto, Calif.

[73] Assignee: Xerox Corporation, Stamford, Conn.

[21] Appl. No.: 873,276

[22] Filed: Jun. 9, 1986

Related U.S. Application Data

[63] Continuation of Ser. No. 567,584, Jan. 3, 1984, abandoned.

[51] Int. Cl.$^4$ ............................................. H01L 21/22
[52] U.S. Cl. .................................. 148/186; 29/569 L; 357/16; 372/45
[58] Field of Search ............... 29/569 L; 148/1.5, 186; 372/45

[56] References Cited

U.S. PATENT DOCUMENTS

| | | | |
|---|---|---|---|
| 3,982,207 | 9/1976 | Dingle et al. | 357/16 |
| 4,209,350 | 6/1980 | Ho et al. | 357/49 |
| 4,261,771 | 4/1981 | Dingle et al. | 148/175 |
| 4,328,469 | 5/1982 | Scifres et al. | 357/17 |
| 4,378,255 | 3/1983 | Holonyak et al. | 148/1.5 |
| 4,438,446 | 3/1984 | Tsang | 357/16 |
| 4,439,782 | 3/1984 | Holonyak, Jr. | 357/4 SL |
| 4,503,540 | 3/1985 | Nakashima et al. | 357/17 |
| 4,585,491 | 4/1986 | Burnham et al. | 29/569 L |

FOREIGN PATENT DOCUMENTS 57-152178 9/1982 Japan ..................... 357/16

OTHER PUBLICATIONS

L. L. Chang et al., "Interdiffusion Between GaAs & AlAs", APL, vol. 29(3), pp. 138–141 (Aug. 1, 1976).
W. D. Laidig et al., "Disorder of an AlAs–GaAs Superlattice by Impurity Diffusion", APL, vol. 38(10), pp. 776–778 (May 15, 1981).
L. W. Kirchoefer et al., "Zn Diffusion & Disordering of an AlAs–GaAs Superlattice Along its Layers", JAP, vol. 53(1), pp. 766–768 (Jan. 1982).
M. D. Camras et al., "Disorder of AlAs/GaAs Superlattices by the Implantation & Diffusion of Impurities", Proceedings of the International Symposium on GaAs & Related Compounds"; Albuquerque, New Mexico, 1982.

Primary Examiner—George T. Ozaki
Attorney, Agent, or Firm—W. Douglas Carothers, Jr.

[57] ABSTRACT

The method of controlling the modeling of the well energy band profile by interdiffusion comprises at least one thin disordering component layer contiguous with a surface of the quantum well layer and including a high content of a disordering component therein compared to the level of content thereof in semiconductor layers immediately adjacent thereto. The disordering components are Al and Ga in the GaAs/GaAlAs regime.

1 Claim, 14 Drawing Figures

METHOD OF CONTROLLING THE MODELING OF THE WELL ENERGY BAND PROFILE BY INTERDIFFUSION

This is a continuation of application Ser. No. 567,584, filed Jan. 3, 1984 now abandoned.

BACKGROUND OF THE INVENTION

This invention relates to improvements to semiconductor structures and more particularly to quantum well structures that are made to undergo interdiffusion disordering after crystal growth.

Interest in the formation of different types of heterostructures in the AlAs-Ga$_{1-x}$Al$_x$As-GaAs alloy system have been further advanced by interdiffusion techniques and, in particular, interdiffusion by disordering of GaAs and AlAs or disordering Ga and Al in the Ga$_{1-x}$Al$_x$As alloy. The use of interdiffusion disordering is of high interest because the selective treatment of these alloy systems after crystal growth promises the possible fabrication of semiconductor lasers, optical waveguides, optical detectors, and III-V integrated electro-optical circuits. Interdiffusion disordering techniques will provide the selective control of regions in as-grown quantum well structures to be "scrambled" or disordered in alloy component content and thereby shifted up in energy gap and reduction in refractive index to form active or waveguide regions in an ordered-crystal structure previously grown using conventional epitaxial methods.

Examples of interdiffusion disordering between Ga and Al in Ga$_{1-x}$Al$_x$As alloy systems or GaAs-AlAs layers or superlattices are disclosed in the following three sets of publications:

(1) L. L. Chang et al., "Interdiffusion between GaAs and AlAs", Applied Physics Letters, Vol. 29(3), pp. 138-141 (Aug. 1, 1976) involves interdiffusion disordering via annealing.

(2) U.S. Pat. No. 4,378,255; W. D. Laidig et al., "Disorder of an AlAs-GaAs Superlattice by Impurity Diffusion", Applied Physics Letters, Vol. 38(10), pp. 776-778 (May 15, 1981); and S. W. Kirchoefer et al., "Zn Diffusion & Disordering of An AlAs-GaAs Superlattice Along its Layers", Journal of Applied Physics, Vol. 53(1), pp. 766-768 (January 1982) all involve interdiffusion disordering via zinc diffusion at temperatures, for example in the range of 600° C.-650° C.

(3) M. D. Camras et al. "Disorder of AlAs/GaAs Superlattices by the Implantation and Diffusion of Impurities", Proceedings of the International Symposium on GaAs and Related Compounds in Albuquerque, N. Mex. in 1982, pp. 233-239, involves interdiffusion disordering via ion implantation, e.g., Si or Zn ion implantation at a temperature, for example, at about 675° C.

Recently, interdiffusion disordering techniques have been extended to single and multiple quantum well laser structures for wavelength modification of their output by interdiffusing Ga and Al at the active layer heterojunctions at high temperatures, for example, in the range of 850° C.-1000° C. By controlling the temperature and time of annealing, the wavelength of the laser structure may be shifted within a range as much as 1000 Å, for example, within the range from 8200 Å to 7200 Å. This technique is disclosed in U.S. patent application Ser. No. 528,766 filed Sept. 2, 1983 entitled "Wavelength Tuning of Quantum Well Lasers By Thermal Annealing" and assigned to the assignee herein now U.S. Pat. No. 4,585,491.

In the case of interdiffusion disordering, via elemental implementation, elemental diffusion or thermal annealing at high temperatures, of a single or multiple quantum well structures, e.g., heterostructure quantum well lasers, the energy band profile of the well will be modified according to the extent of applied interdiffusion disordering treatment. In the case of AlAs-GaAs interfaces, GaAs-GaAlAs interfaces or Ga$_{1-x}$Al$_x$As-Ga$_{1-y}$Al$_y$As (y>x) interfaces, the Al composition gradient across the structure will not be as abrupt as in the case of the epitaxially as-grown structures prior to interdiffusion disordering treatment.

FIGS. 1A-1C illustrate various quantum well structures in the GaAs/GaAlAs regime known in the art. In FIG. 1A, the quantum well structure for the energy band profile 10 comprises a well layer 12 of Ga$_{1-x}$Al$_x$As where x may be in the range of approximately 0 to 0.35, i.e., layer 12 may be a GaAs layer or a low Al content layer of GaAlAs. In order to exhibit a quantum size effect, layer 12 may have a thickness in the range of 15 Å to 500 Å. The cladding layers 15 and 16 comprise Ga$_{1-x'}$Al$_{x'}$As where x' may be in the range of approximately 0.15 to 1.00, i.e., layers 15 and 16 may be high Al content layers of GaAlAs or AlAs.

Interdiffusion disordering will cause an interdiffusion between Ga and Al at the interfaces between the quantum well region 12 and the cladding layers 15 and 16. As illustrated in FIG. 1A, the original energy band profile 10 forming the single quantum well region 12 has a finite square-shaped well. With interdiffusion disordering, the initially finite square-shaped well becomes more parabolic-like in shape, converting the well into a shallower, rounded edge Ga$_{1-x}$Al$_x$As well due to Ga-Al interdiffusion. This altered profile is illustrated by dotted line 13. This "shallower" of the well 12 shifts the confined particle electron and hole states of the well to different energy levels. A more detailed discussion concerning these states may be found in U.S. Pat. No. 4,585,491 supra.

The energy band profile 20 in FIG. 1B comprises a similar quantum well structure but includes the further outer layers 17 and 18 of Ga$_{1-x''}$Al$_{x''}$As where x" may be in the range of approximately 0.30 to 1.00, i.e., layers 17 and 18 may be high Al content layers of GaAlAs or Al while intermediate cladding layers 15 and 16 may be in the range of approximately 0.15 to 0.85, i.e., layers 15 and 16 may be intermediate Al content layers of GaAlAs. With sufficient interdiffusion disordering, the initially finite square shaped well 12 becomes more curved or parabolic-like, as illustrated by the altered profile shown by dotted line 14. To be noted is that the interdiffusion disordering in profile 20 has been more substantial as compared to profile 10, as more disordering is shown to have taken place "filling" the well 12.

The energy band profile 30 of FIG. 1C represents a superlattice of the single well of FIG. 1B and comprises four quantum wells 12A, 12B, 12C and 12D of Ga$_{1-x}$Al$_x$As where x is the range of approximately 0 to 0.35. The wells are separated by three barrier layers 15A, 15B and 15C comprising Ga$_{1-x'}$Al$_{x'}$As where x' is in the range of 0.15 to 0.85. It is to be noted that layers 15A, 15B and 15C could alternatively be AlAs. With interdiffusion disordering, the initially square shaped wells 12A, 12B, 12C and 12D become curved line shaped as depicted by the dotted ine 19 in FIG. 1C.

There are situations where it is necessary to ensure that in the epitaxial growth of interfaces to form quantum well structures, the well width at the top of wells is required to be controlled or is desired not to be too wide. Also, longer processing times in the application of interdiffusion disordering techniques are not desirable from the standpoint of device yield.

SUMMARY OF THE INVENTION

According to this invention, means is employed in connection with semiconductor structures having at least one quantum well layer, and capable of exhibiting quantum size effect, to modify the energy band profile thereof. Such means comprises at least one thin disordering component layer contiguous with a surface of the quantum well layer and including a high content of a disordering component therein compared to the level of content thereof in layers immediately adjacent thereto, if that component is present therein. The disordering components are Al and Ga in the GaAs/GaAlAs regime. In the present invention, the disordering component, Al, is of paramount consideraion in providing a Al reservoir for interdiffusion with the disordering component, Ga, present in higher Ga content in intermediate adjacent layer or layers, such as, an active region or waveguide. The disordering component layer functions as a component reservoir for interdiffusion disordering of the quantum well layer. The higher disordering component in the thin disordering component layers provided adjacent to the well layers provide a ready source for the disordered component, e.g., Al, thereby protecting against early depletion of Al during the interdiffusion process as well as reducing time for the application of the interdifusion disordering process, which reduces the length of time necessary for subjecting as-grown structures to higher temperatures required for such processes. The thin component layers also concurrently act to provide an increased barrier at the quantum well interface for carrier or optical confinement, which is particularly desirable in regions where carrier or optical confinement is important such as in the formation of semiconductor laser structures.

The disordering component layer may be provided contiguous with either one or both quantum well layer surfaces. Also, the disordering component layers may be provided in conjunction with multiple quantum well structures.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 2A illustrates the energy band profile for a single thin disordering component layer in a single quantum well structure.

FIG. 2B illustrates another energy band profile for a single quantum well structure with a pair of contiguous thin disordering component layers.

FIG. 2C illustrates an energy band profile for a multiple quantum well structure.

FIG. 2D illustrates an energy band profile of a quantum well structure having a multistep energy band profile similar to FIG. 2B except with higher thin disordering component layers of higher disordering component content.

FIG. 2E illustrates an energy band profile of a multiple quantum well structure having an energy band profile similar to FIG. 2C except with thin disordering component layers of higher disordering component content.

FIGS. 2F, 2G and 2H illustrate the energy band profile for a quantum well structure with contiguous thin disordering component layers wherein the intermediate cladding layers have a graded index/varied energy band profile.

DESCRIPTION OF THE PREFERRED EMBODIMENTS

Figure 1A:
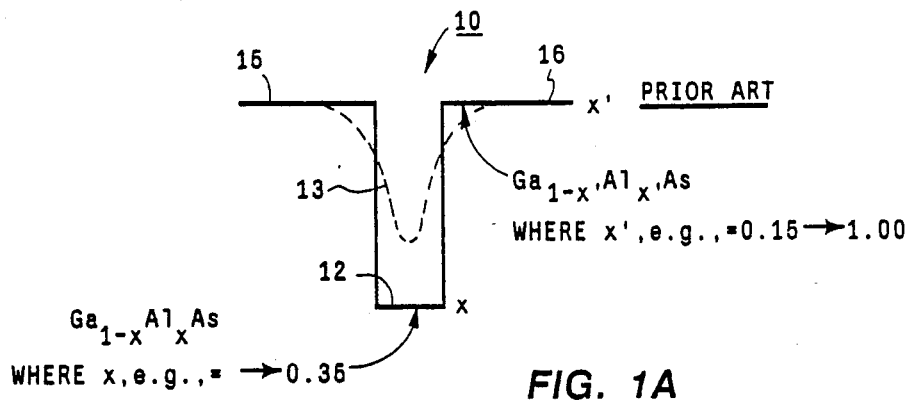
FIGS. 1A, 1B and 1C illustrate the energy band profile before and after interdiffusion disordering for single and multiple quantum well structures known in the art.
Figure 1B:
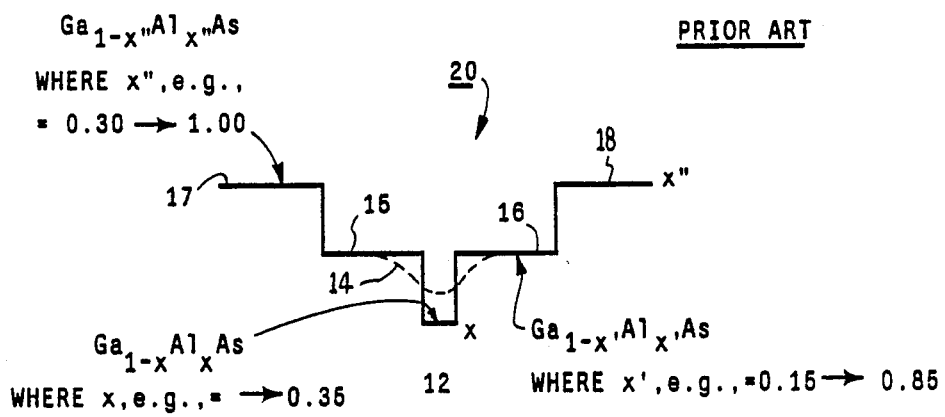
Figure 1C:
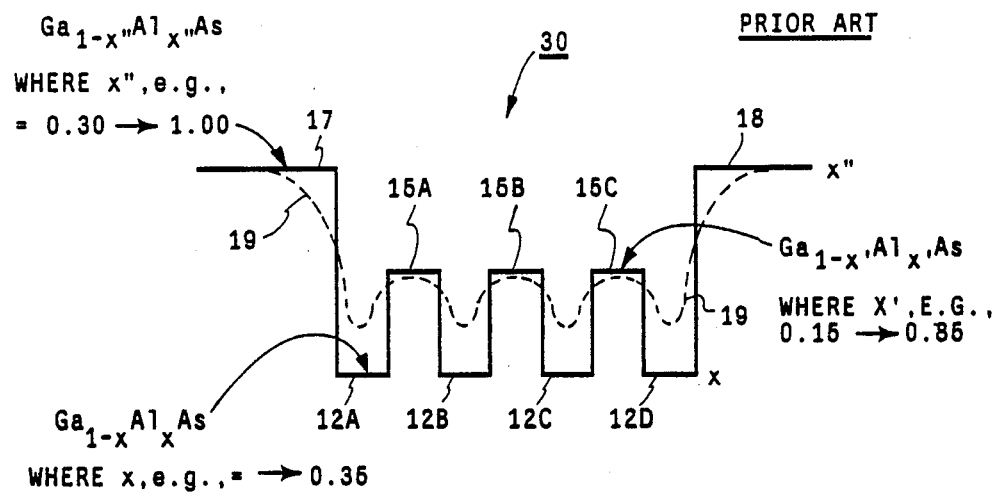
Figure 2A:
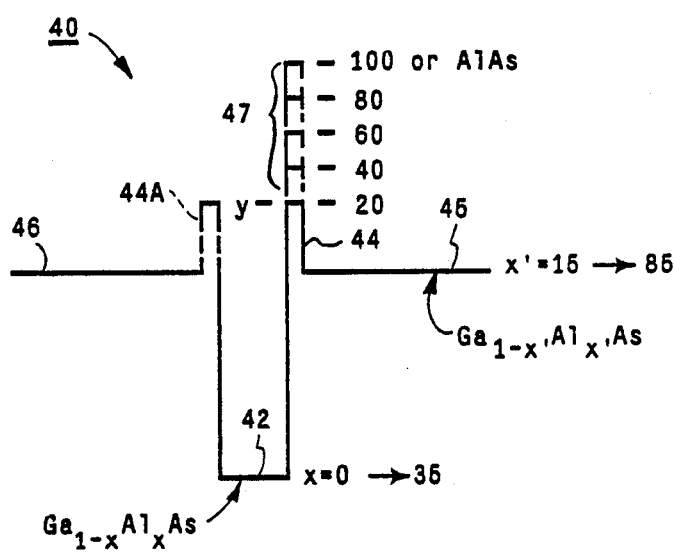
FIGS. 2A-2H illustrate various energy band profiles for single and multiple quantum well structures comprising the thin disordering component layer of the instant invention.

Reference is now made to FIG. 2A illustrating a "generic" energy band profile 40 relating to the present invention. Profile 40 represents a single quantum well layer 42 of $Ga_{1-x}Al_xAs$ where X may be in the range, for example, of approximately 0 to 0.35. Deposited contiguous with the surfaces of well 42 is at least one thin disordering component layer 44 of $Ga_{1-y}Al_yAs$ wherein Al is the disordering component and y is relatively much larger as compared to $Al_X$ in quantum well layer 42, i.e., $y > X$. Beyond disordering component layer 44 is cladding layer 45 of $Ga_{1-x'}Al_{x'}As$ where X' may be, for example, in the range of approximately 0.15 to 0.85. However, the content of $Al_y$ in layer 44, is larger than that of $Al_{x'}$ in layer 45, preferably by at least 15%. The other surface of quantum well layer 42 is provided with contiguous layer 46 of $Ga_{1-x'}Al_{x'}As$ where X' may also be, for example, in the range of approximately 0.15 to 0.85.

A thin disordering component layer 44A may also be contiguous with the other surface of the quantum well layer 42. Layer 44A is illustrated in dotted outline in FIG. 2A. While it may be normally desired to provide a pair of thin disordering component layers 44 and 44A contiguous with well layer 42, it is within the teachings of this invention to provide a single layer 44 to obtain the results and advantages of the present invention.

As indicated above, thin disordering component layer 44 or layers 44 and 44A are provided to have a disordering component content, i.e., Al, that exceeds that of cladding layers 45 and 46 as well as layer 42. There is preferably at least a 15% difference in Al content between quantum well layer 42 and cladding layers 45 and 46 and at least a 15% difference in Al content between cladding layers 45 and 46. Relative to layer 44 in FIG. 2A, there is illustrated in dotted outline form at 47 examples of the energy band level representative of the range of Al content that might be contained in layer 44 up to 100% or AlAs as long as there is a difference in Al content between layer 44 and layer 45. Thus, for example, if layer 45 was X' equal to 0.40, layer 44 would be y equal to 0.55 or more. As another example, with X' equal to 0.85, layer 44 would be preferably X' equal to 1.00 or AlAs.

The purpose of the disordering component layers is not only to function as increased barriers for carriers useful in the design of semiconductor devices, but also provide a reservoir for the disordering component, Al, to assist in the interdiffusion disordering process. These additional thin layers of high Al content provide a positive means for supply of Al to the well layer interface during interdiffusion disordering to improve control of the modeling of the quantum well energy band profile, carrier concentration and junction properties. Also, the employment of the disordering component layers provides the advantages of increased well width at the top of the well for trapping and confining carriers as well as preventing early depletion of Al during the interdiffusion disordering process.

The thickness of the quantum well layer 42 may be in the range of 15 Å to 500 Å. For many applications, the thickness is in the lower end of this range, e.g, heterostructure quantum well lasers may have a quantum well layer in the thickness range of 600 Å to 80 Å. The thickness of the disordering component layers 44 and 44A may be as small as one atomic layer or about 3 Å and as large as 300 Å.

FIGS. 2B-2H illustrate various energy band profiles for quantum well structures in which the disordering component layers of the present invention may be utilized. However, many other examples are possible but those shown are believed to be representative thereof.

Figure 2B:
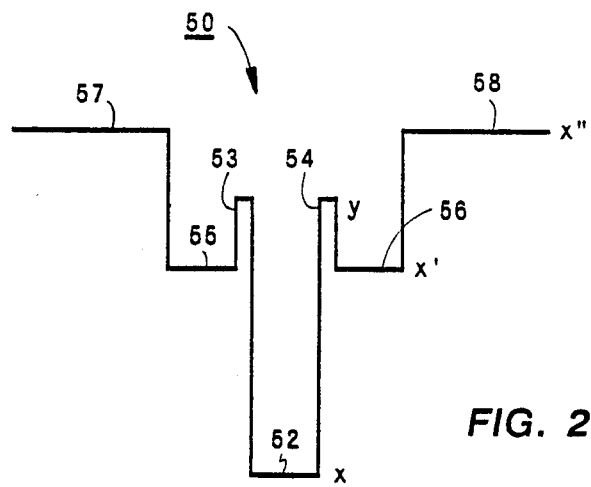

The energy band profile 50 of FIG. 2B comprises the quantum well layer 52 of, for example, $Ga_{1-x}Al_xAs$ where X may be, for example, in the range of approximately 0 to 0.35, contiguous disordering component layers 53 and 54 of $Ga_{1-y}Al_yAs$ where Y may be, for example, in the range of approximately 0.15 to 0.85, the intermediate cladding layers 55 and 56 of $Ga_{1-x'}Al_{x'}As$ where X' may be, for example, in the range of approximately 0.15 to 0.85 depending upon the Al content of quantum well layer 52, disordering component layers 53 and 54 and outer layers 57 and 58. Outer layers 57 and 58 of $Ga_{1-x''}Al_{x''}As$ may, for example, have X'' in the range of approximately 0.35 to 1.00.

Figure 2C:
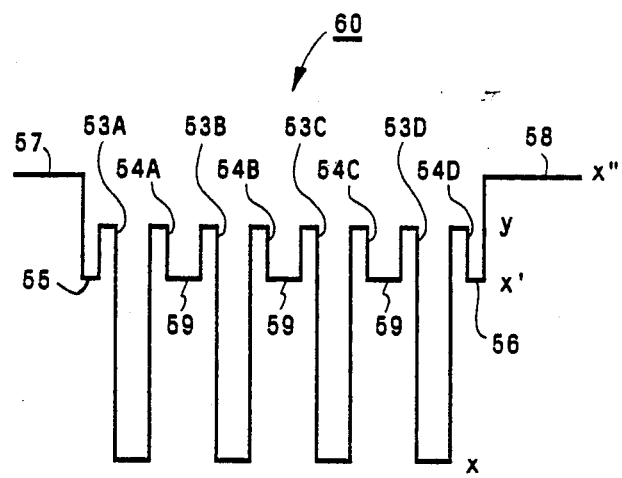

FIG. 2C is a multiple quantum well representation of the well structure of FIG. 2B. The energy band profile 60 illustrates four well layers 52A, 52B, 52C and 52D with contiguous disordering component layers 53A, 53B, 53C and 53D; and 54A, 54B, 54C and 54D. These disordering layers are, in turn, separated by intermediate layers 59 which are of the same composition as cladding layers 55 and 56.

Figure 2D:
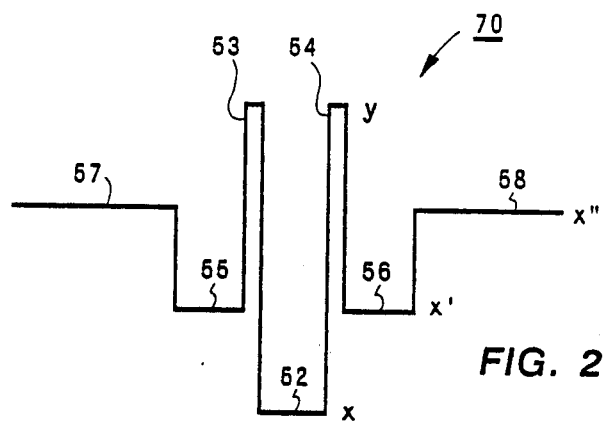

The energy band profile 70 of FIG. 2D is the same as profile 50 of FIG. 2B except that the disordering component layers 53 and 54 are of high Al content, e.g., are layers of $Ga_{1-y}Al_yAs$ where y is equal to 0.85 or are layers of AlAs. Such a structure incorporated into a heterostructure laser would provide good carrier confinement while permitting beam spreading into the intermediate layers 55 and 56 for optical confinement and waveguiding.

Figure 2E:
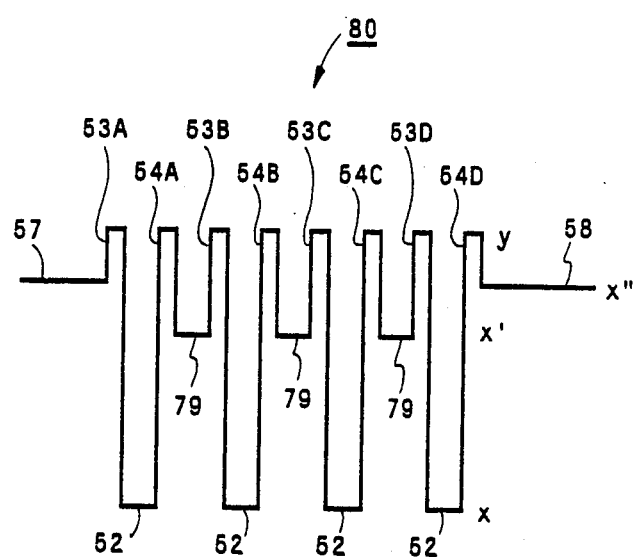

FIG. 2E is a multiple quantum well representation of the well structure of FIG. 2D. The energy band profile 80 illustrate four quantum well layers 52A, 52B, 52C and 52D with contiguous disordering component layers 53A, 53B, 53C and 53D; and 54A, 54B, 54C and 54D. These disordering layers are, in turn, separated by means of the intermediate layers 79 of the same or similar composition as cladding layers 55 and 56.

As indicated previously relative to generic energy band profile of FIG. 2A, the $Al_y$ disordering component in disordering component layers 53 and 54 may vary between, for example, 0.15 and 1.00, depending upon the Al content in immediately adjacent layers 52 and 55;56 respectively comprising $Ga_{1-x}Al_xAs$ and $Ga_{1-x'}Al_{x'}As$, so that $y > X' > X \geq 0$.

Figure 2F:
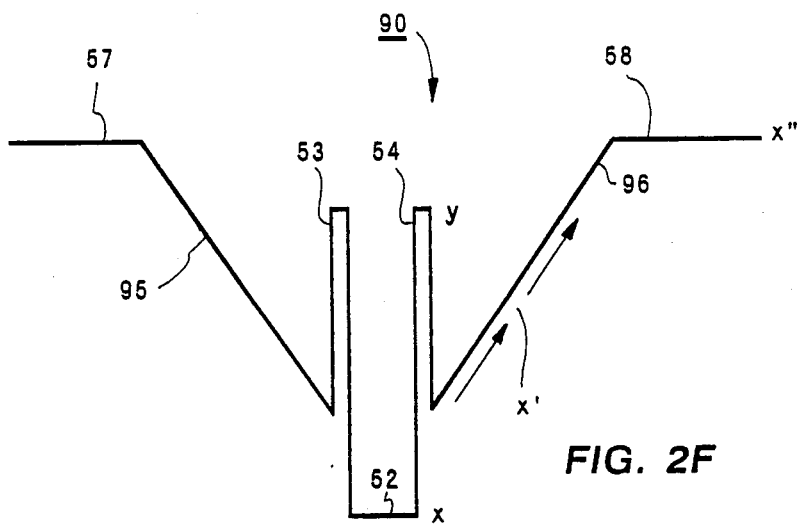
Figure 2G:
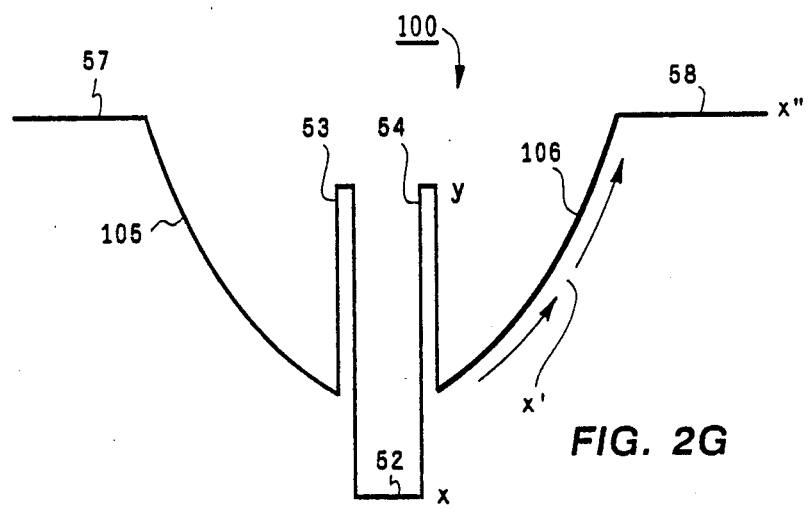
Figure 2H:
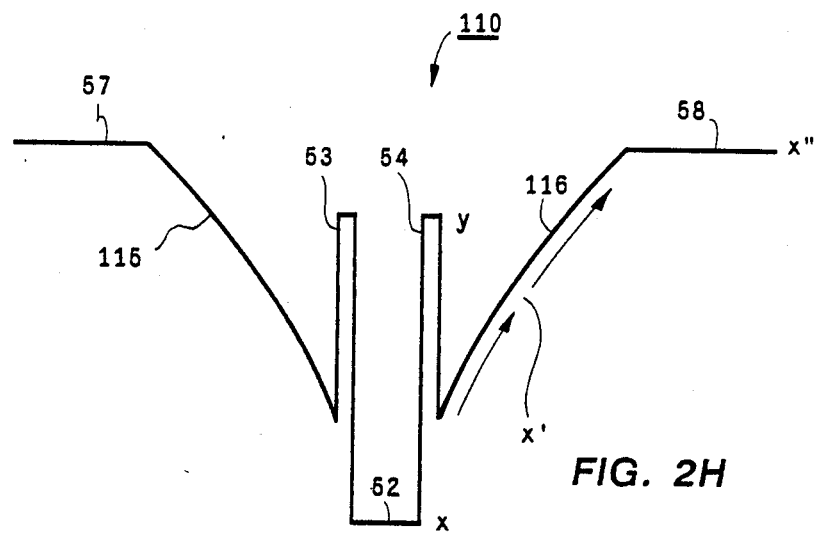

FIGS. 2F, 2G and 2H illustrate three examples of the energy band profile for single quantum well structures that have a spatial variation in the energy band profile in the regions of the intermediate cladding layers. FIG. 2F illustrates the energy band profile 90 for a quantum well structure the same as illustrated for profile 50 of FIG. 2B except with intermediate cladding layers 95 and 96 having linear spatial variations in alloy content of $Ga_{1-x'}Al_{x'}As$ where, for example, X' may progress gradually in linear fashion from about 0.15 to 1.00 during the growth process.

FIG. 2G illustrates the energy band profile 100 for a quantum well structure having also the same as profile 50 except that intermediate cladding layers 105 and 106 have a parabolic-like or concave-like spatial variation in the alloy content of $Ga_{1-x'}Al_{x'}As$ where, for example, X' may progress gradually in parabolic fashion from about 0.15 to 1.00 during the growth process. FIG. 2H illustrates the energy band profile 110 for a quantum well structure having also the same as profile 50 except that intermediate cladding layers 115 and 116 have an inverted parabolic-like or convex-like spatial variation in alloy content of $Ga_{1-x'}Al_{x'}As$ where, for example, X' may progress gradually in parabolic fashion from about 0.15 to 1.00 during the growth process.

The advantage of employing quantum well structures represented by the energy band profiles 90, 100 and 110 of FIGS. 2F, 2G and 2H is the ability to tailor design the beam intensity cross-section of the beam output, for example, in a semiconductor laser, due to the presence of the gradient in the respective intermediate layers 95, 96; 105, 106 and 115, 116. In other words, one may design the intensity profile of the beam produced by the laser. The employment of the parabolic shaped profile of FIG. 2G, for example, will produce a Gaussian shaped intensity profile in the output beam.

With the advantage of beam intensity profile shaping, the combined employment of the disordering component layers 53 and 54 in a semiconductor laser structure allows for wavelength tuning of the laser, upon the application of interdiffusion disordering, the example, as taught by U.S. Pat. No. 4,585,491. As a result semiconductor lasers may be easily fabricated under present technology to have a combined predesigned beam intensity profile and selected wavelength characteristic.

Figure 3A:
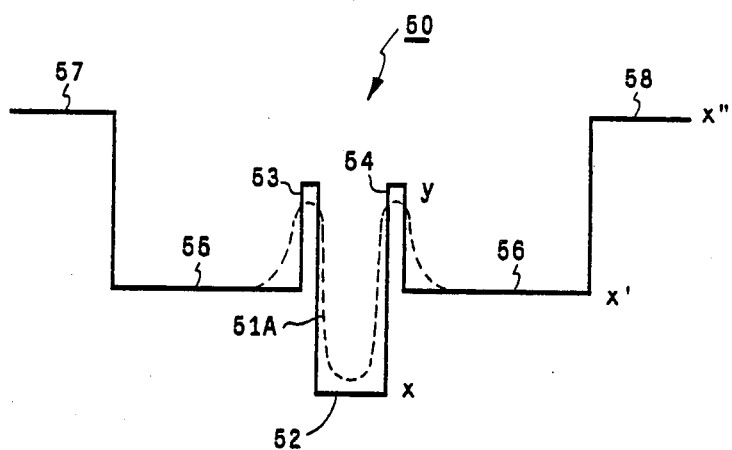
FIGS. 3A-3C illustrate various stages of the effect of interdiffusion disordering on the energy band profile for the single quantum well structure of FIG. 2B.
Figure 3B:
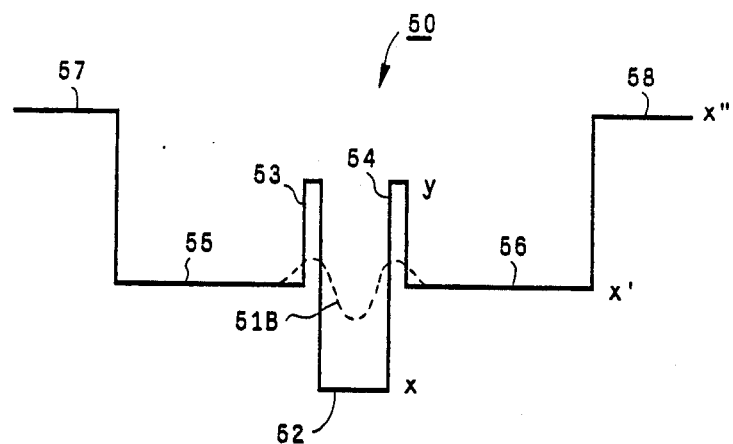
Figure 3C:
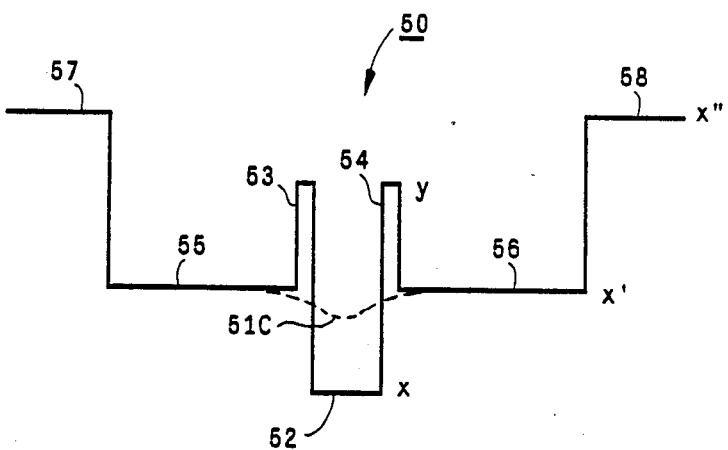

FIGS. 3A-3C illustrate three progressive stages in the alteration of the original energy band profile as the chosen interdiffusion disordering technique is applied to a chosen quantum well structure. The quantum well structure chosen is based upon the profile 50 in FIG. 2B. This profile is replicated in FIG. 3A with the dotted line representing the altered energy band profile due to interdiffusion disordering. Of course, in each representation, there must be conservation of the disordering component.

FIG. 3A represents the initial stages of interdiffusion disordering wherein disordering between the quantum well layer 52, disordering component layers 53 and 54 as well as intermediate layers 55 and 56 has commenced with the initial interdiffusion between Ga and Al in these layers. The disordering component, Al, interdiffuses from layers 53 and 54 where there is comparatively large amounts of Al available and present for effective controlled interdiffusion behavior.

As can be seen in FIG. 3A, the well of layer 52 has begun to "fill in" as the original profile of the layers 53 and 54 have begun to recede due to the interdiffusion of Al to regions of well layer 52. Dotted line 51A represents this initial change in the energy band profile.

As interdiffusion disordering proceeds, the well of layer 52 "fills in" more and more while the profile of layers 53 and 54 further recede. This is illustrated in FIG. 3B by the dotted line profile 51B and as further extended in FIG. 3C by the dotted line profile 51C. In the case of profile 51C, the well of layer 52 is practically filled in with the interdiffused Al nearly the same extent as found in intermediate layers 55 and 56.

The previous discussion relative to energy band profile do not take into account doping type and concentration necessary for current injection devices. Small changes in index of refraction and effective energy band profiles will occur depending upon doping type and concentration employed. Further, the extent of X' and X" composition in the ternary GaAlAs, for example, in layers 45,46; 55,56; and 57,58, may not be precisely the same due to adjustment for differences in doping type and concentration. These factors are well known in art and, therefore, are not treated in the discussion of the present invention.

Another consideration relative to the present invention is the employment of techniques to relieve strain developed between large changes in Al content between two or more, or among several consecutively deposited layers or superlattices. For example, instead of a growing an AlAs/GaAs superlattice, one may grow $AlAs_{1-z}P_z$/GaAs superlattice where Z is approximately 0.04. This provides for optimum lattice matching in these structures. Lattice matching the ternary GaAlAs to GaAs would require an appropriate addition of P, dependent on the Al content in the ternary. Other elements for purposes of lattice matching may be used, such as, Sb and In.

While this invention has been described with specific embodiments, it is evident that many alternatives, modifications and variations will be apparent to those skilled in the art in the light of the foregoing description. Accordingly, it is intended to embrace all such alternatives, modifications and variations as fall within the spirit and scope of the appended claims.

What is claimed is:

1. The method of controlling the modeling of the quantum well energy band profile in a semiconductor structure having a plurality of semiconductor layers comprising the steps of providing at least one quantum well in said structure, providing a disordering layer in said structure contiguous with one surface of said quantum well and having therein a disordering component in an amount of at least 15% or more relative to at least those semiconductor layers in said structure contiguous with said disordering layer containing the same disordering element, and subjecting said structure to interdiffusion disordering along selected regions thereof to incrementally alter the energy band profile of said quantum well in said selected regions.

* * * * *